United States Patent [19]

Sasaki et al.

[11] Patent Number: 5,404,031
[45] Date of Patent: Apr. 4, 1995

[54] SEMICONDUCTOR LIGHT EMITTING DEVICE WITH CURRENT CONFINING LAYER

[75] Inventors: Kazuaki Sasaki, Yao; Hiroshi Nakatsu, Tenri; Osamu Yamamoto; Masanori Watanabe, both of Nara; Saburo Yamamoto, Uda, all of Japan

[73] Assignee: Sharp Kabushiki Kaisha, Osaka, Japan

[21] Appl. No.: 270,115

[22] Filed: Jul. 1, 1994

Related U.S. Application Data

[63] Continuation of Ser. No. 25,434, Mar. 3, 1993, abandoned.

[30] Foreign Application Priority Data

Mar. 3, 1992 [JP] Japan .................. 4-045808

[51] Int. Cl.⁶ .................................. H01L 33/00
[52] U.S. Cl. ....................... 257/95; 257/96; 257/97; 372/45; 372/46; 372/48
[58] Field of Search .......... 257/79, 13, 94, 95, 257/96, 97; 372/48, 46, 45

[56] References Cited

U.S. PATENT DOCUMENTS

| | | | |
|---|---|---|---|
| 4,831,630 | 5/1989 | Scifres et al. | 372/48 X |
| 4,899,359 | 2/1990 | Yano et al. | 372/48 X |
| 5,073,806 | 12/1991 | Idei | 372/48 X |
| 5,208,821 | 5/1993 | Berger et al. | 372/48 |

FOREIGN PATENT DOCUMENTS

| | | |
|---|---|---|
| 0430041 | 6/1991 | European Pat. Off. . |
| 4017632 | 12/1990 | Germany . |
| 57-162382 | 10/1982 | Japan ............ 372/48 |
| 59-219976 | 12/1984 | Japan . |
| 60-235486 | 11/1985 | Japan . |
| 63-093188 | 4/1988 | Japan . |
| 3-3373 | 1/1991 | Japan . |
| 3-89568 | 4/1991 | Japan . |
| 2053564 | 2/1981 | United Kingdom . |

OTHER PUBLICATIONS

Patent Abstracts of Japan, vol. 10, No. 91, (E-394) (Apr. 9, 1986).
Patent Abstracts of Japan, vol. 9, No. 89, (E-309) (Apr. 18, 1985).
Patent Abstracts of Japan, vol. 12, No. 330, (E-655) (Sep. 7, 1988).
Scott et al., "Code: a novel MOVPE technique for the single stage growth of buried ridge double heterostructure lasers and waveguides", *Journal of Crystal Growth* (1988) 93:820-824.
Yoshikawa et al., "A self-aligned ridge substrate laser fabricated by single—step MOVPE", *Journal of Crystal Growth* (1988) 93:843-849.

*Primary Examiner*—William Mintel
*Attorney, Agent, or Firm*—Morrison & Foerster

[57] ABSTRACT

A semiconductor light emitting device which allows part of an active layer to generate light by supplying current to the part of the active layer is disclosed. The semiconductor light emitting device includes: a semiconductor substrate having upper and lower surfaces, the upper surface having a stepped portion, the stepped portion dividing the upper surface into at least a first area and a second area; a current confining layer, formed on the upper surface of the substrate, the current confining layer being discontinuous at the stepped portion, the current flowing through an area between the first area and the second area of the substrate; a multilayer structure formed on the current confining layer, the multilayer structure including the active layer; a first electrode which covers only part of an upper surface of the multilayer structure; and a second electrode formed over the lower surface of the substrate. In the semiconductor light emitting device, the light generated from part of the active layer is extracted to the outside through a portion of the upper surface of the multilayer structure which is not covered with the first electrode.

9 Claims, 7 Drawing Sheets

SEMICONDUCTOR LIGHT EMITTING DEVICE WITH CURRENT CONFINING LAYER

This is a continuation of application Ser. No. 08/025,434, filed Mar. 3, 1993, now abandoned.

BACKGROUND OF THE INVENTION

1. Field of the Invention

The present invention relates to a semiconductor light emitting device, and more particularly to a semiconductor light emitting device with which generated light can be effectively extracted to the outside.

2. Description of the Related Art

Since light emitting diodes (hereinafter referred to as LEDs) have high reliability, they are used as light sources in various types of display apparatus as a substitute for a tungsten lamp. Furthermore, the LEDs have attracted much attention as display devices which are used indoors and outdoors. As the intensity of light emitted from the LED becomes higher, it is expected that the LED will be an alternative medium to a neon lamp in the future. In a few years, the outdoor display market of LEDs will remarkably progress. The high-intensity LED was first realized as an LED for emitting red light having a double heterostructure (DH) of GaAlAs system a few years ago.

Recently, a DH-type LED for emitting light of a band from orange to green of InGaAlP system is made so as to be of a high-intensity type. In order to increase the luminous efficiency of such LEDs, it is important to increase the generating efficiency of light within the LED and also it is important to increase the extracting efficiency of the generated light to the outside.

FIGS. 10A and 10B show an exemplary LED of the prior art. The LED is an InGaAlP-system LED 100 capable of emitting light of a green band. FIG. 10A is a transverse cross-sectional view of the LED 100 in which current flow is indicated by broken lines. FIG. 10B is a transverse cross-sectional view of the LED 100 in which light generation is indicated by solid lines (a–d).

In the LED 100, an n-GaAs buffer layer 109 (thickness: 0.1 micrometers ($\mu$m)), an n-In$_{0.5}$(Ga$_{0.3}$Al$_{0.7}$)$_{0.5}$P carrier confining layer (cladding layer) 102 (thickness: 1.5 $\mu$m), a non-doped In$_{0.5}$Ga$_{0.55}$Al$_{0.45}$)$_{0.5}$P active layer 103 (thickness: 0.7 $\mu$m), a p-In$_{0.5}$)Ga$_{0.3}$Al$_{0.7}$)$_{0.5}$P window layer (cladding layer) 104 (thickness: 1.5 $\mu$m), a p-Ga$_{0.3}$Al$_{0.7}$As current diffusing layer 105 (thickness: 5 $\mu$m), and a p-GaAs ohmic contact layer 106 are grown on an n-GaAs substrate 101, in this order, by metal organic chemical vapor deposition (MOCVD).

An upper electrode 107 is formed on the p-GaAs ohmic contact layer 106. A lower electrode 108 is formed on the lower surface of the n-GaAs substrate 101. The upper electrode 107 and the underlying ohmic contact layer 106 are formed by etching a peripheral portion thereof while leaving a portion having a size for lead bonding (width: about 70 $\mu$m) unetched. A current injected from the upper electrode 107 is diffused in the current diffusing layer 105 as indicated by the broken lines in FIG. 10A. The diffused current is injected over the entire non-doped In$_{0.5}$)Ga$_{0.55}$Al$_{0.45}$)$_{0.5}$P active layer 103, so as to generate light.

In the LED 100, the current is injected over the entire non-doped In$_{0.5}$(Ga$_{0.55}$Al$_{0.45}$)$_{0.5}$P active layer 103, but a larger part of the injected current concentrates in a portion 103a directly under the upper electrode 107. As a result, an amount of light generated from the portion 103a is larger as compared with the remaining portion. Regarding light beams (a–c) which travel upwardly from the portion 103a directly under the upper electrode 107, the light beams are reflected from the upper electrode 107, as is shown in FIG. 10B. Accordingly, the light beams are not extracted to the outside. Regarding light beams which travel upwardly but obliquely, if a light beam (d) is incident on an upper face 105a at a critical angle or a larger angle, the light beam is not extracted to the outside, either. Therefore, the larger part of the current injected to the active layer 103 is disadvantageously consumed for generating light which cannot be extracted.

SUMMARY OF THE INVENTION

The semiconductor light emitting device of this invention which allows part of an active layer to generate light by supplying current to the part of the active layer, includes: a semiconductor substrate having upper and lower surface, the upper surface having a stepped portion, the stepped portion dividing the upper surface into at least a first area and a second area; a current confining layer, formed on the upper surface of the substrate, the current confining layer being discontinuous at the stepped portion, the current flowing through an area between the first area and the second area of the substrate; a multilayer structure formed on the current confining layer, the multilayer structure including the active layer; a first electrode which covers only part of an upper surface of the multilayer structure; and a second electrode formed over the lower surface of the substrate, wherein the light generated from the part of the active layer is extracted to the outside through a portion of the upper surface of the multilayer structure which is not Covered with the first electrode.

Thus, the invention described herein makes possible the advantage of providing a semiconductor light emitting device with excellent intensity in which a light emitting portion of an active layer is defined as a portion excluding a portion directly under an upper electrode, and a construction of which is designed to easily extract the generated light from the upper side, whereby the light extraction efficiency is increased.

This and other advantages of the present invention will become apparent to those skilled in the art upon reading and understanding the following detailed description with reference to the accompanying figures.

BRIEF DESCRIPTION OF THE DRAWINGS

FIG. 1A is a cross-sectional view of an LED and FIG. 1B is a view showing current flow and light generation.

FIG. 4A is a cross-sectional view of an LED and FIG. 4B is a view illustrating current flow and light generation.

FIG. 6A is a cross-sectional view of an LED and FIG. 6B is a view illustrating current flow and light generation.

FIG. 10A is a cross-sectional view illustrating current flow in the LED, and FIG. 10B is a cross-sectional view illustrating light generation.

DESCRIPTION OF THE PREFERRED EMBODIMENTS

Figure 1A:
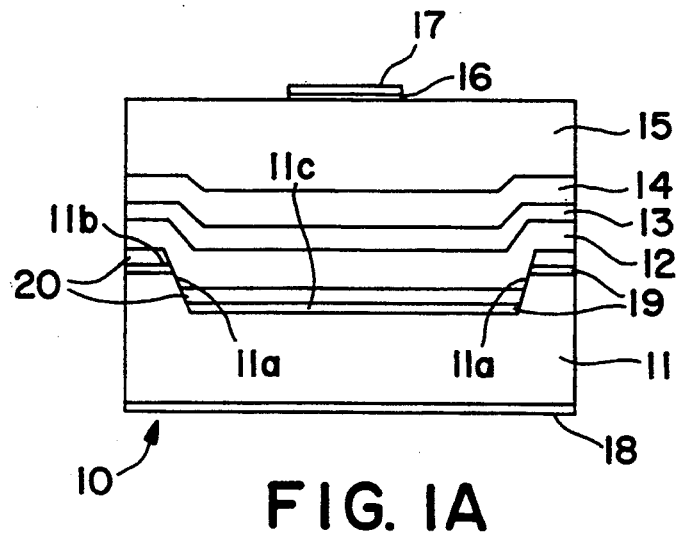
FIGS. 1A and 1B are schematic views showing an exemplary construction of a semiconductor light emitting device according to the invention.
Figure 1B:
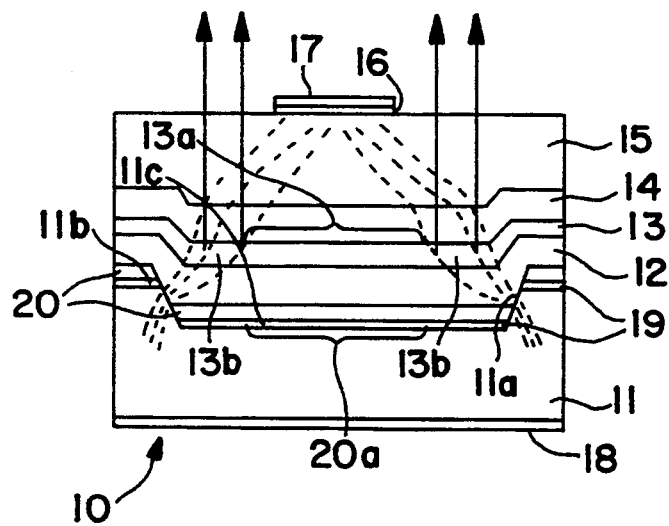

Hereinafter, a semiconductor light emitting device of the invention will be described by way of examples and with reference to the drawings. FIGS. 1A and 1B show a semiconductor light emitting device (LED) 10. FIG. 1A is a transverse cross-sectional view of the LED 10. FIG. 1B is a cross-sectional view illustrating current flow and light generation.

The LED 10 includes a multilayer structure on an n-GaAs substrate 11. In the multilayer structure, an n-GaAs buffer layer 19, a p-GaAs current confining layer 20, an n-InGaAlP carrier confining layer (cladding layer) 12, an InGaAlP active layer 13, a p-InGaAlP window layer (cladding layer) 14, a p-GaAlAs current diffusing layer 15, and a P-GaAs contact layer 16 are formed, in this order.

An upper electrode 17 is deposited on an upper surface of the p-GaAs contact layer 16. A lower electrode 18 is deposited on a lower surface of the n-GaAs substrate 11. The upper electrode 17 and the p-GaAs contact layer 16 are formed on a center portion of an upper surface of the p-GaAlAs current diffusing layer 15.

An upper surface of the n-GaAs substrate 11 has a recess. This means that the upper surface of the n-GaAs substrate 11 is constituted by a high-level plane (a higher portion 11b), a low-level plane (a lower portion 11c) and a slope for joining the portions of different levels (a stepped portion 11a). The higher portion 11b corresponds to a peripheral portion of the upper surface of the n-GaAs substrate 11. Only on the higher portion 11b and the lower portion 11c, an n-GaAs buffer layer 19 and a p-GaAs current confining layer 20 are grown. In other words, the n-GaAs buffer layer 19 and the p-GaAs current confining layer 20 are formed so as to have discontinuity at the stepped portion 11a.

On the p-GaAs current confining layer 20, the n-InGaAlP carrier confining layer (cladding layer) 12, the InGaAlP active layer 13, the p-InGaAlP window layer (cladding layer) 14, and the p-GaAlAs current diffusing layer 15 are sequentially formed.

The plan shape of the lower portion 11c is square, the same as the plan shape of the upper electrode 17. However, the lower portion 11c is sufficiently larger than the upper electrode 17. As a result, a portion 20a of the current confining layer 20 of a second conductivity type directly under the upper electrode 17 is located within the range of the lower portion 11c. Moreover, the current confining layer 20 on the lower portion 11c is formed without discontinuity.

Now, a fabrication process of the above semiconductor light emitting device is described with reference to FIGS. 2A through 2D.

Figure 2A:
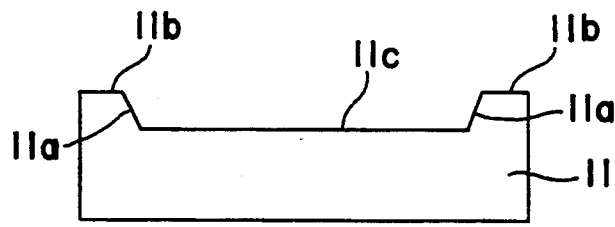
FIGS. 2A through 2D are schematic views showing a manufacturing process of the semiconductor light emitting device of the invention.

First, as is shown in FIG. 2A, a stepped portion having a level difference of 2 $\mu$m is formed in the n-GaAs substrate 11. In this example, a (100) plane substrate is used as the n-GaAs substrate 11. The stepped portion is formed, for example, in the following manner. First, a photoresist layer is formed to cover the upper surface of the n-GaAs substrate 11. Then, only an exposed area of the upper surface of the n-GaAs substrate 11 is etched, so as to form a recess in the n-GaAs substrate 11.

Figure 2B:
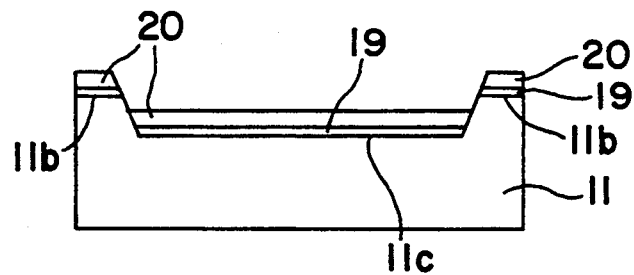

Next, as is shown in FIG. 2B, the n-GaAs buffer layer 19 and the p-GaAs current confining layer 20 are sequentially formed on the n-GaAs substrate 11. In this formation, the crystal growth conditions for the layers 19 and 20 are adjusted such that the n-GaAs buffer layer 19 and the p-GaAs current confining layer 20 are discontinuous at the stepped portion 11a. That is, the layers 19 and 20 are selectively grown on the higher portion 11b and the lower portion 11c. In this example, the crystal growth is carried out at a temperature of 720° C. and at a pressure of 76 Torr. The n-GaAs buffer layer 19 and the p-GaAs current confining layer 20 are formed by MOCVD. In this example case, the thicknesses of the n-GaAs buffer layer 19 and the p-GaAs current confining layer 20 are set to be 0.1 $\mu$m and 1 $\mu$m, respectively, both on the higher portion 11b and on the lower portion 11c of the n-GaAs substrate 11, by adjusting the crystal growth conditions for the layers 19 and 20. In this fabrication process, the current confining structure is easily formed in a self-alignment manner with the stepped structure of the n-GaAs substrate 11.

Figure 2C:
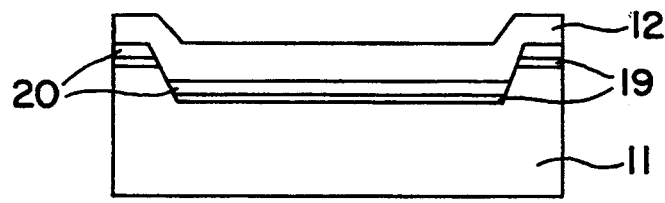

Then, the n-InGaAlP carrier confining layer (cladding layer) 12 is formed so as to have different thicknesses on the higher portion 11b and on the lower portion 11c. The thickness of the layer 12 on the lower portion 11c is larger than that on the higher portion 11b in order not to have discontinuity at the stepped portion 11a. In this example case, as is shown in FIG. 2C, the thickness of the layer 12 on the higher portion 11b is 1.5 $\mu$m, and the thickness of the layer 12 on the lower portion 11c is 3.0 $\mu$m.

Figure 2D:
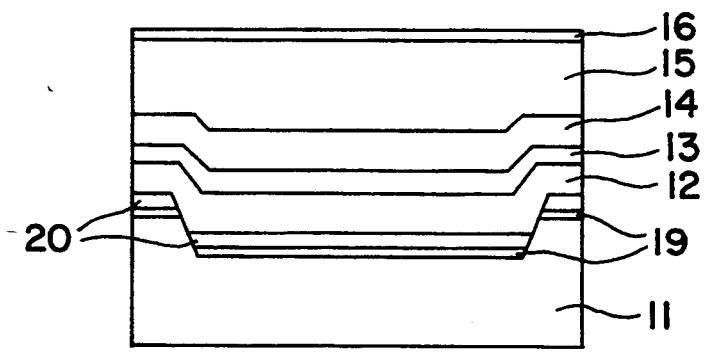

The InGaAlP active layer 13 is formed in such a manner that the thickness thereof on the lower portion 11c is 1 $\mu$m and the thickness thereof on the higher portion 11b is 0.8 $\mu$m. The p-InGaAlP window layer (cladding layer) 14 is formed in such a manner that the thickness thereof on the lower portion 11c is 1.5 $\mu$m, and the thickness thereof on the higher portion 11b is 1.3 $\mu$m. The p-GaAlAs current diffusing layer 15 is formed, as is shown in FIG. 2D, in such a manner that the thickness thereof on the lower portion 11c is 5 $\mu$m, and the thickness thereof on the higher portion 11b is 4.9 $\mu$m. The p-GaAs contact layer 16 is formed to have a thickness of 0.2 $\mu$m. The upper electrode 17 and the p-GaAs contact layer 16 are etched to leave a center portion having a width of about 70 $\mu$m for lead bonding unetched.

According to the LED 10 of this example, a current from the n-GaAs substrate 11 is injected into the multilayer structure through the stepped portion 11a where the p-GaAs current confining layer 20 is discontinuous, as is indicated by the broken lines in FIG. 1B. Since the upper electrode 17 is formed at the center of the multilayer structure, a larger part of the current is injected into a portion 13b of the active layer 13. The portion 13b is a remaining portion of the active layer 13 formed on the lower portion 11c excluding a portion 13a directly under the upper electrode 17. Light is efficiently generated in the remaining portion 13b of the active layer 13, as is indicated by the solid lines in FIG. 1B. Therefore, the generated light can be extracted upwardly from the upper face of the multilayer structure without being stopped by the upper electrode 17. Thus, a light emitting diode having good light extraction efficiency can be provided.

Figure 3A:
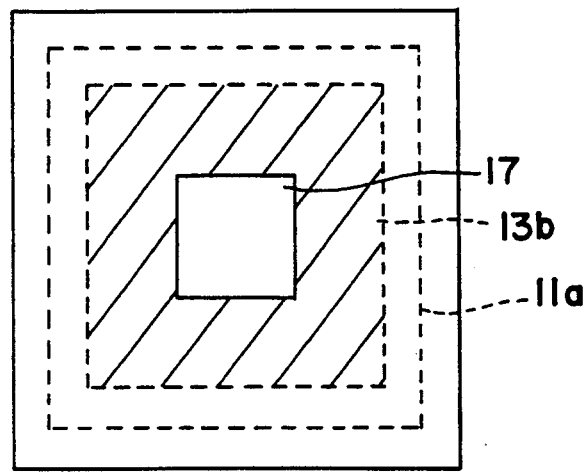
FIGS. 3A and 3B are plan views each showing a surface shape of the LED of FIG. 1A.
Figure 3B:
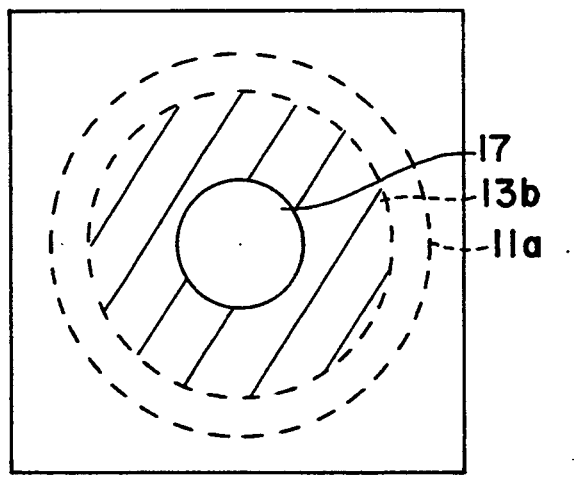

The plan shapes of the upper electrode 17, the stepped portion 11a and the light generating portion 13b of the active layer 13 may be rectangular as is shown in FIG. 3A, and alternatively may be circular as is shown in FIG. 3B.

When the LED 10 shown in FIGS. 1A and 1B was mounted on a lamp having a diameter of 5 mm by molding, a light intensity of 3 candela (cd) can be obtained at a wavelength of 555 nm at 20 mA.

Figure 4A:
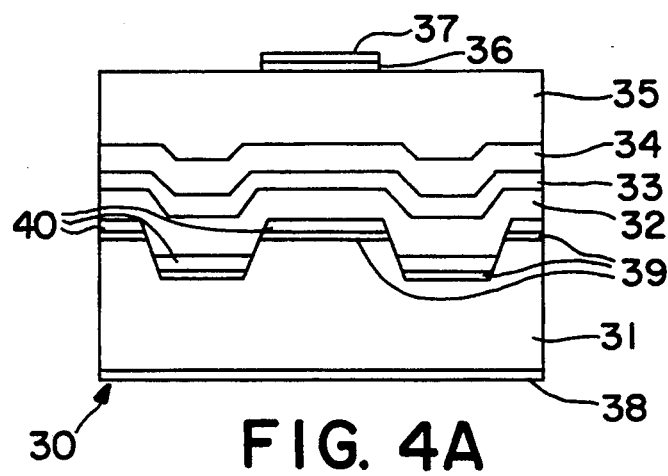
FIGS. 4A and 4B are schematic views showing another construction of a semiconductor light emitting device according to the invention.
Figure 4B:
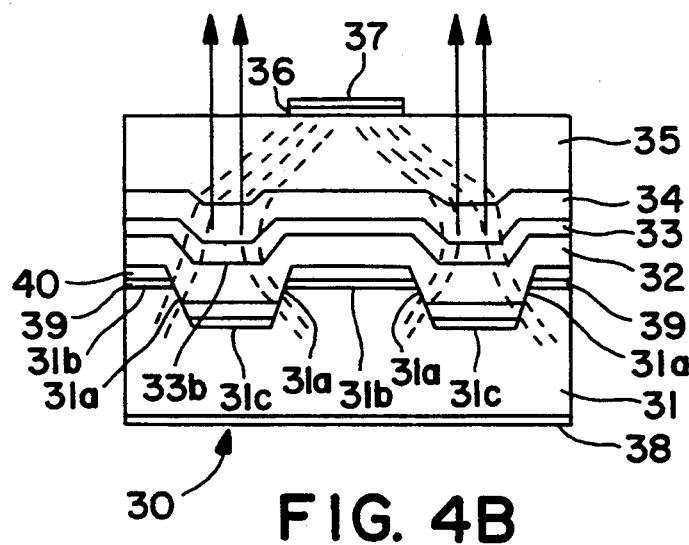

FIGS. 4A and 4B show another example of a semiconductor light emitting device according to the invention.

In an LED 30 of this example, a p-GaAs substrate 31 is used instead of the n-GaAs substrate 11 of the first example. Accordingly, all the layers in this example are of conductivity types opposite to those in the first example.

The shape of a stepped portion 31a of the p-GaAs substrate 31 is defined by higher portions 31b positioned in a peripheral portion and directly under an upper electrode 37 of the p-GaAs substrate 31, and by a lower portion 31c positioned between the higher portions 31b. There are two slopes for joining the higher portions 31b and the lower portion 31c, and the two slopes are opposite to each other.

Also, in the LED 30 of this example, an n-GaAs current confining layer 40 is formed so as to have discontinuity at an inner stepped portion 31a. A current is also injected through this discontinuous portion, as is indicated by the broken lines in FIG. 4B. A larger part of the current is efficiently injected into a portion excluding the central higher portion 31b directly under the upper electrode 37. Therefore, in this example, the light extraction efficiency is good, the same as in the first example.

Figure 5:
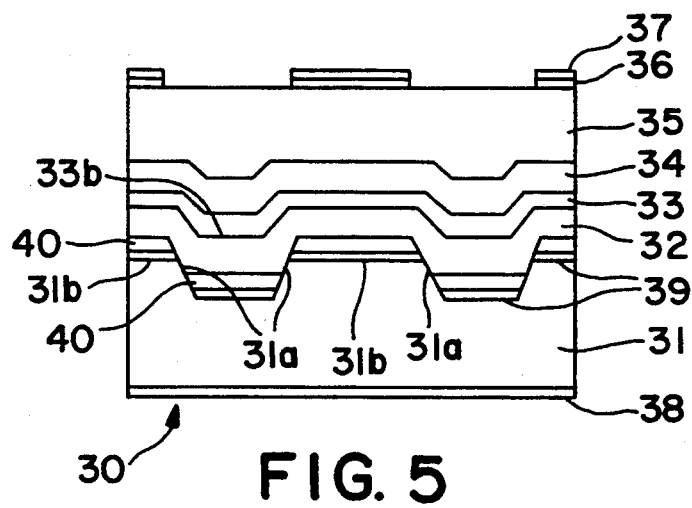
FIG. 5 is a cross-sectional view showing another construction of a semiconductor light emitting device according to the invention.

In the LED 30 of this example, a light intensity of 3.2 cd can be obtained at a wavelength of 567 nm (5 mm$\phi$, 20 mA). Alternatively, as is shown in FIG. 5, an additional upper electrode 37 may be formed on a peripheral portion of an upper surface of the multilayer structure.

Figure 6A:
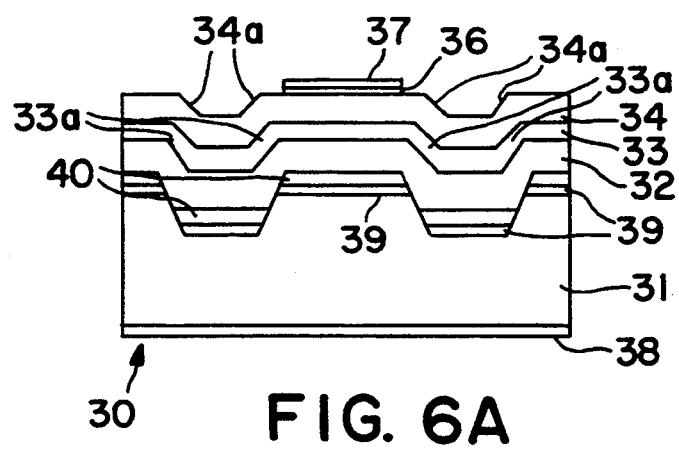
FIGS. 6A and 6B are schematic views showing another construction of a semiconductor light emitting device according to the invention.
Figure 6B:
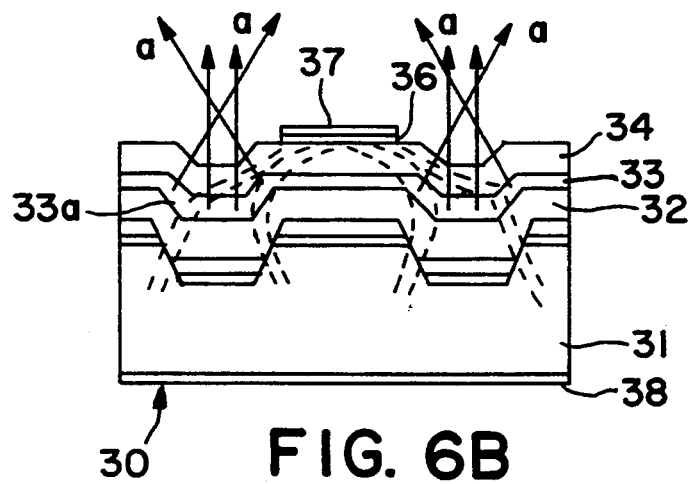

FIGS. 6A and 6B show still another example of a semiconductor light emitting device according to the invention. FIG. 6A is a transverse cross-sectional view. FIG. 6B is a cross-sectional view illustrating current flow and light generation.

An LED 30 of this example has substantially the same construction as that of the LED 30 shown in FIGS. 4A and 4B, except that the LED 30 of this example has no n-GaAlAs current diffusing layer. In the LED 30 of this example, an n-InGaAlP window layer (cladding layer) 34 having stepped portions 34a is formed as an uppermost layer. As is shown in FIG. 6B, light generated from an active layer 33 can efficiently be extracted through the stepped portions 34a.

Figure 7:
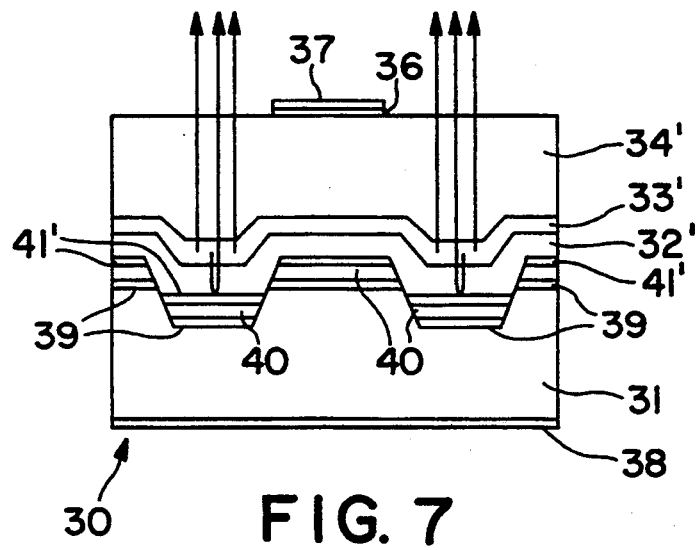
FIG. 7 is a cross-sectional view showing another construction of a semiconductor light emitting device according to the invention.

FIG. 7 shows still another example of a semiconductor light emitting device according to the present invention. An LED 30 of this example has substantially the same construction as that of the LED 30 shown in FIGS. 4A and 4B, except for the following differences. The differences are in that the LED 30 shown in FIG. 7 has a layer 41' which is referred to as a light reflecting layer on a current confining layer 40, and in that the LED 30 shown in FIG. 7 is not provided with a current diffusing layer. An exemplary case where the construction of FIG. 7 is formed of AlGaAs system materials will be described.

In the LED 30 of FIG. 7, on a p-GaAs substrate 31, a p-GaAs buffer layer 39, an n-GaAs current confining layer 40, the light reflecting layer 41' of p-type or n-type $Ga_{0.5}Al_{0.5}As/AlAs$ (ten layers), a p-$Ga_{0.3}Al_{0.7}As$ carrier confining layer (cladding layer) 32', a non-doped $Ga_{0.62}Al_{0.38}As$ active layer 33', an n-$Ga_{0.3}Al_{0.7}As$ window layer (cladding layer) 34', and an n-GaAs ohmic contact layer 36 are layered, in this order. An upper electrode 37 is deposited on an upper surface of the n-GaAs ohmic contact layer 36. A lower electrode 38 is deposited on the lower surface of the p-GaAs substrate 31.

In the LED 30 of this example, a current is injected in the same way as in the second example. However, generated light beams which travel downwardly are reflected upwardly by the light reflecting layer 41' and can be extracted to the outside, as is shown in FIG. 7. As to the LED 30 of this example, when it is mounted on a lamp having a diameter of 5 mm, a light intensity of 10 cd can be obtained at a wavelength of 655 nm (red) at 20 mA. If twenty layers of $In_{0.5}(Ga_{0.5}Al_{0.5})_{0.5}P$ and InAlP are alternately layered, the light reflecting layer of this example can be applied to the LEDs of the InGaAlP system described in the first through fourth examples.

Figure 8:
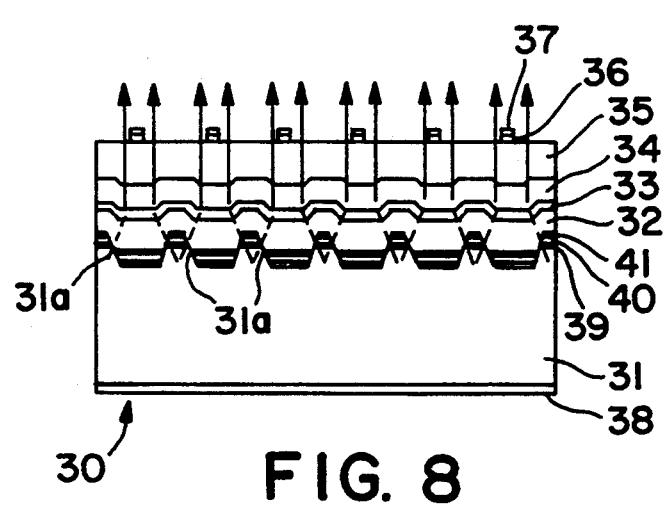
FIG. 8 is a cross-sectional view showing still another construction of a semiconductor light emitting device according to the invention.
Figure 9:
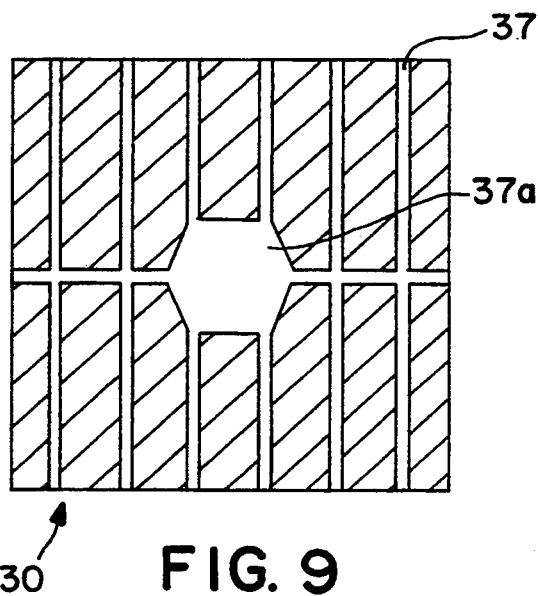
FIG. 9 is a plan view showing an upper electrode shown in FIG. 8.
Figure 10A:
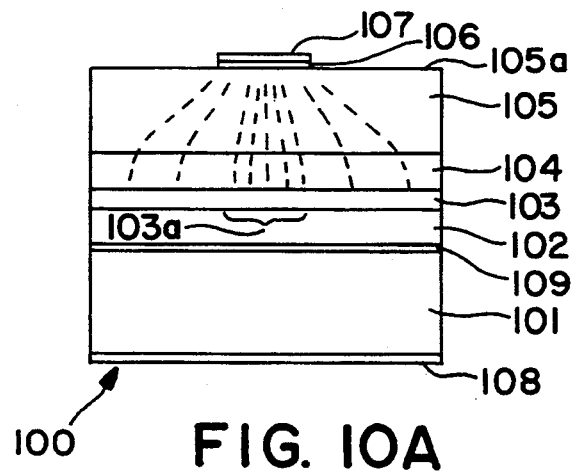
FIGS. 10A and 10B are schematic views showing an exemplary construction of a conventional LED.
Figure 10B:
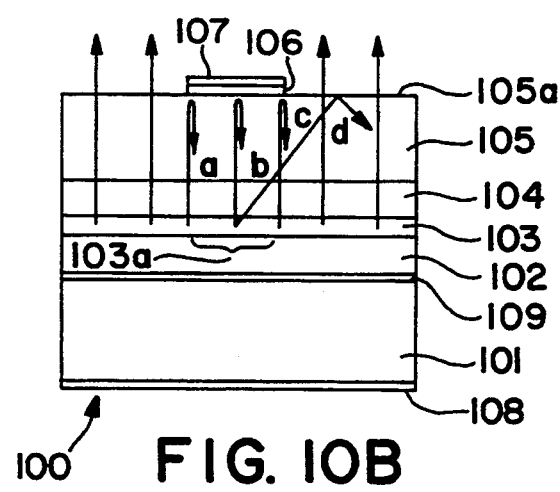

FIG. 8 shows a sixth example of a semiconductor light emitting device according to the invention. In FIG. 8, the injection of current is indicated by the broken lines, and the traveling of generated light is indicated by the solid lines. In a LED 30 of the sixth example, the structure of grown layers is substantially the same as those in the first and second examples except for the following differences. The differences are in that the structure of this example is provided with a light reflecting layer 41 as in the fifth example, and in that a number of stepped portions 31a are formed so as to provide multiple current injecting portions as light emitting portions. As is shown in FIG. 9, the surface of the upper electrode 37 has a multi-stripe shape, and at the center of the surface of the upper electrode 37, a central electrode 37a is formed. In the LED 30 of this example, the current is uniformly injected into the multiple light emitting portions, and the heat which is generated due to the current injection and the light generation is distributed. Accordingly, the luminous efficiency of the LED 30 is further increased and the reliability thereof is enhanced. In the LED 30 of this example, a light intensity of 5 cd can be obtained at a wavelength of 555 nm (5 mm$\phi$, 20 mA).

The material systems used in the examples of the invention are not limited to the InGaAlP system and the GaAlAs system which are described above. Alternatively, the material system may be a ZnSSe system, a CdZnS system, or the like. The conductivity type of the substrate is not specified, i.e., a p-type or n-type one is appropriately used. The conductivity types of the grown layers can be determined in accordance with the selected conductivity type of the substrate. The employed grown method may alternatively be an LPE method, an MBE method, an ALE method, a CBE method, or the like, other than the MOCVD method. The current diffusing layer and the ohmic contact layer is not necessarily provided. These two layers may not be fabricated as far as the resistance is not high.

According to the invention, on a substrate of a first conductivity type having a stepped portion, a current confining layer of a second conductivity type is formed in such a manner that the layer is discontinuous at the stepped portion. On the current confining layer, a carrier confining layer (cladding layer) of the first conductivity type, an active layer, and a window layer (cladding layer) of the second conductivity type are formed. Directly under an upper electrode, the current confining layer of the second conductivity type is formed without discontinuity. Therefore, a current is injected into the remaining portion of the active layer excluding a portion of the active layer directly under the upper electrode, through the discontinuous portion of the current confining layer formed on the substrate. A light generating portion of the active layer corresponds to the portion excluding the portion directly under the upper electrode, whereby the generated light can easily be extracted. Therefore, the light extraction efficiency of the generated light is improved. Thus, a light emitting diode with excellent light intensity can be provided.

This invention provides a short-wavelength and high-intensity LED for emitting light of a band from orange to green, and which can be applied to an LED for emitting light of a band from infrared to red.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device which allows part of an active layer to generate light by supplying current to said part of said active layer, said device comprising:

a semiconductor substrate having upper and lower surfaces, said upper surface having a stepped portion, said stepped portion dividing said upper surface into at least a first area and a second area;

a current confining layer formed both in said first area and in said second area of said upper surface of said substrate, said current confining layer being discontinuous at said stepped portion, said current flowing through an area between said first area and said second area of said substrate;

a multilayer structure formed on said current confining layer, said multilayer structure including said active layer;

a first electrode which covers only part of an upper surface of said multilayer structure; and a second electrode formed over said lower surface of said substrate, wherein said light generated from said part of said active layer is extracted to the outside through a portion of said upper surface of said multilayer structure which is not covered with said first electrode.

2. A semiconductor light emitting device according to claim 1, said device further comprising a light reflecting layer formed on said current confining layer, wherein said light reflecting layer reflects part of said light generated from said part of said active layer which is incident on said light reflecting layer to the outside.

3. A semiconductor light emitting device according to claim 1, wherein said semiconductor substrate has a recess formed in a portion of said upper surface thereof, said first area of said upper surface corresponding to a bottom face of said recess, said second area of said upper surface corresponding to a portion of said upper surface excluding said portion of said recess, and wherein said first electrode is positioned above said first area, the size of said first electrode being smaller than that of said first area.

4. A semiconductor light emitting device according to claim 1, wherein said upper surface has a plurality of stepped portions, thereby providing a plurality of parts for generating light in said active layer, and wherein said first electrode has a shape which does not cover said parts for generating light.

5. A semiconductor light emitting device according to claim 1, wherein the current confining layer is a GaAs layer.

6. A semiconductor light emitting device according to claim 5, wherein the multilayer structure is an InGaAlP material system.

7. A semiconductor light emitting device according to claim 3, wherein each of said recess and said first electrode has a rectangular shape.

8. A semiconductor light emitting device according to claim 3, wherein each of said recess and said first electrode has a circular shape.

9. A semiconductor light emitting device which allows a plurality of parts of an active layer to generate light by supplying current to said plurality of parts of said active layer, said device comprising:

a semiconductor substrate having upper and lower surface, said upper surface having a plurality of stepped portions, said plurality of stepped portions dividing said upper surface into first areas and second areas;

a current confining Layer formed on said upper surface of said substrate, said current confining layer being discontinuous at said plurality of stepped portions, said current flowing through areas between said first and said second areas of said substrate;

a multilayer structure formed on said current confining layer, said multilayer structure including said active layer;

a first electrode which covers only part of an upper surface of said multilayer structure, said first electrode having a shape which does not cover said plurality of parts of said active layer; and a second electrode formed over said lower surface of said substrate, wherein said light generated from said plurality of parts of said active layer is extracted to the outside through portions of said upper surface of said multilayer structure which are not covered with said first electrode, and said first electrode comprises a center electrode portion and a multi-stripe portion, said center electrode portion being located at the center of said first electrode, said multi-stripe portion having a pair of straight strips extending in opposite directions from said center electrode portion, and parallel strips extending in perpendicular directions to said straight strips from said center electrode portion and said pair of straight strips.

* * * * *